(12) United States Patent
Lim

(10) Patent No.: US 7,782,231 B2
(45) Date of Patent: Aug. 24, 2010

(54) KEY SCAN TYPE INPUT DEVICE

(75) Inventor: Jae Nam Lim, Changwon-si (KR)

(73) Assignee: LG Electronics Inc., Seoul (KR)

( * ) Notice: Subject to any disclaimer, the term of this patent is extended or adjusted under 35 U.S.C. 154(b) by 947 days.

(21) Appl. No.: 11/601,841

(22) Filed: Nov. 20, 2006

(65) Prior Publication Data

US 2007/0115147 A1    May 24, 2007

(30) Foreign Application Priority Data

Nov. 22, 2005    (KR) .................. 10-2005-0111804

(51) Int. Cl.
*H03M 11/00*    (2006.01)

(52) U.S. Cl. ..................... 341/26; 341/22; 200/5 A; 200/5 R

(58) Field of Classification Search ............. 341/22, 341/26; 200/5 A, 5 R
See application file for complete search history.

(56) References Cited

U.S. PATENT DOCUMENTS

| | | | | |
|---|---|---|---|---|
| 4,562,315 A * | 12/1985 | Aufderheide | ............... | 200/5 A |
| 4,651,995 A * | 3/1987 | Henkel | ................. | 273/237 |
| 6,713,897 B2 * | 3/2004 | Caldwell | ................ | 307/125 |
| 7,151,432 B2 * | 12/2006 | Tierling | ................. | 340/2.28 |
| 7,180,017 B2 * | 2/2007 | Hein | ................... | 200/5 R |

* cited by examiner

*Primary Examiner*—Timothy Edwards, Jr.
(74) *Attorney, Agent, or Firm*—Ked & Associates, LLP

(57) ABSTRACT

A key scan type input device includes a microcomputer having a plurality of output ports for outputting scan signals and a plurality of input ports for receiving key signals in a scan signal section, a first key matrix having a plurality of system control keys arranged in a x*y arrangement, lines of the keys being connected to the respective output ports of the microcomputer and columns of the keys being connected to the respective input ports, and a second key matrix having one or more system control keys arranged in a m*m arrangement, lines and columns being connected in parallel at least two of the output ports and at least two input ports of the microcomputer.

14 Claims, 1 Drawing Sheet

KEY SCAN TYPE INPUT DEVICE

BACKGROUND OF THE INVENTION

1. Field of the Invention

The present invention relates to an input device, and more particularly, to a key scan type input device that can prevent a key input error due to the defect of components thereof.

2. Description of the Related Art

A cooking device is one of typical home appliances. The cooling device includes an electric oven, an electronic range, an electric range, a gas range, and a gas oven range. Although, the concept of the present invention is not limited to the cooking device, the cooking device will be used to describe the concept of the present invention.

Recently, a key scan type input device or a touch type input device has been used to manipulate an operation (on/off operation or mode setting operation) of the home appliances instead of using a physical structure such as a switch or a knob.

A typical key scan type input device includes a key matrix on which a plurality of keys for controlling the system are arranged in a matrix pattern and a microcomputer applying a scan signal to the key matrix and determining a key signal output from the key matrix in a scan signal section.

That is, the keys include a power on/off key (STOP/Clear), on/off keys (LF ON-OFF, RF ON-OFF, LR ON-FF, RR ON-OFF, CR ON-OFF). A variety of number keys for the start, timer, cooking time, start time, bake, broil, oven light, cool/warm, and power level are constituted in the single key matrix.

Each column of the key matrix is connected to a corresponding output port and each line of the key matrix is connected to a corresponding input port of the microcomputer.

With the above-described structure, the microcomputer sequentially outputs scan signals (pulse signals) with respect to the respective columns of the key matrix through the output ports. When the user inputs a specific key, the microcomputer determines the input signal of the relevant key by receiving the key signal output from the key matrix through the input port in the scan signal section.

For example, when the user inputs a open/clear key on the key matrix, a key signal having a low level I input through the relevant input port at a timing point where the scan signal is output from the output port of the microcomputer so that the microcomputer can recognize the open/clear.

Therefore, the key scan input device is designed to read the key contacted by the user by applying a scan signal (pulse signal) to each column of the key matrix on which all of the key are arranged.

However, problems of the typical key input device are that the key signal output is normally realized when there is a process or property error in the circuit components or the circuit components are damage, or a short circuit or opening occurs between the circuit components, and thus the information input by the user through the key cannot be accurately read. Particularly, when the keys related to the on/off of the power or load (heater) are damaged, the power cannot be turned off or the operation of the load cannot be stopped. This may cause the fire or the damage of the whole system.

Furthermore, when the user touches the off key but the system is not turned off due to the malfunction of the off key, the user may think that the system is turned off and thus open the door. In this case, since the internal heat of the system may be applied to the user, the user may be injured due to the heat.

SUMMARY OF THE INVENTION

Accordingly, the present invention is directed to a key scan type input device that substantially obviates one or more problems due to limitations and disadvantages of the related art.

An object of the present invention is to provide a key scan type input device that can prevent a key error that may be caused by malfunction of components or other operational errors.

Another object of the present invention is to provide a key scan type input device that can actively confront a possibility of danger such as the fire or safety issue of the user, which may be caused when there is a system error in important keys related to the power on/off or the system operation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a key scan type input device including: a microcomputer having a plurality of output ports for outputting scan signals and a plurality of input ports for receiving key signals in a scan signal section; a first key matrix having a plurality of system control keys arranged in a x*y arrangement, lines of the keys being connected to the respective output ports of the microcomputer and columns of the keys being connected to the respective input ports; and a second key matrix having one or more system control keys arranged in a m*m arrangement, lines and columns being connected in parallel at least two of the output ports and at least two input ports of the microcomputer.

In another aspect of the present invention, there is provided a key scan type input device including: a microcomputer having a plurality of output ports and a plurality of input ports; a first key matrix for transmitting a key signal to the microcomputer in a section of the scan signal output from the microcomputer when there is a user contact with a key; and a second key matrix having a key connected in parallel to at least two output ports of the microcomputer so that at least two scan signals can be input to the key in one cycle of the scan signal output from the microcomputer and can be simultaneously output to the microcomputer in a normal operation.

In still another aspect of the present invention, there is a key scan type input device including: a microcomputer having a plurality of output ports and a plurality of input ports; a first key matrix for transmitting a key signal to the microcomputer in a section of the scan signal output from the microcomputer when there is a user contact with a key; and a second key matrix having a key connected in parallel to at least two output ports of the microcomputer so that at least two scan signals can be simultaneously output to the microcomputer in a normal operation even when one of the scan signal is input from the microcomputer to the key.

According to the present invention, the reliability of the important keys can be enhanced and thus the operational reliability of the system and the reliability of the user safety can be improved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawing, which is included to provide a further understanding of the invention and are incorporated in and constitute a part of this application, illustrate embodiment(s) of the invention and together with the description serve to explain the principle of the invention. In the drawing.

DETAILED DESCRIPTION OF THE INVENTION

Figure 1:
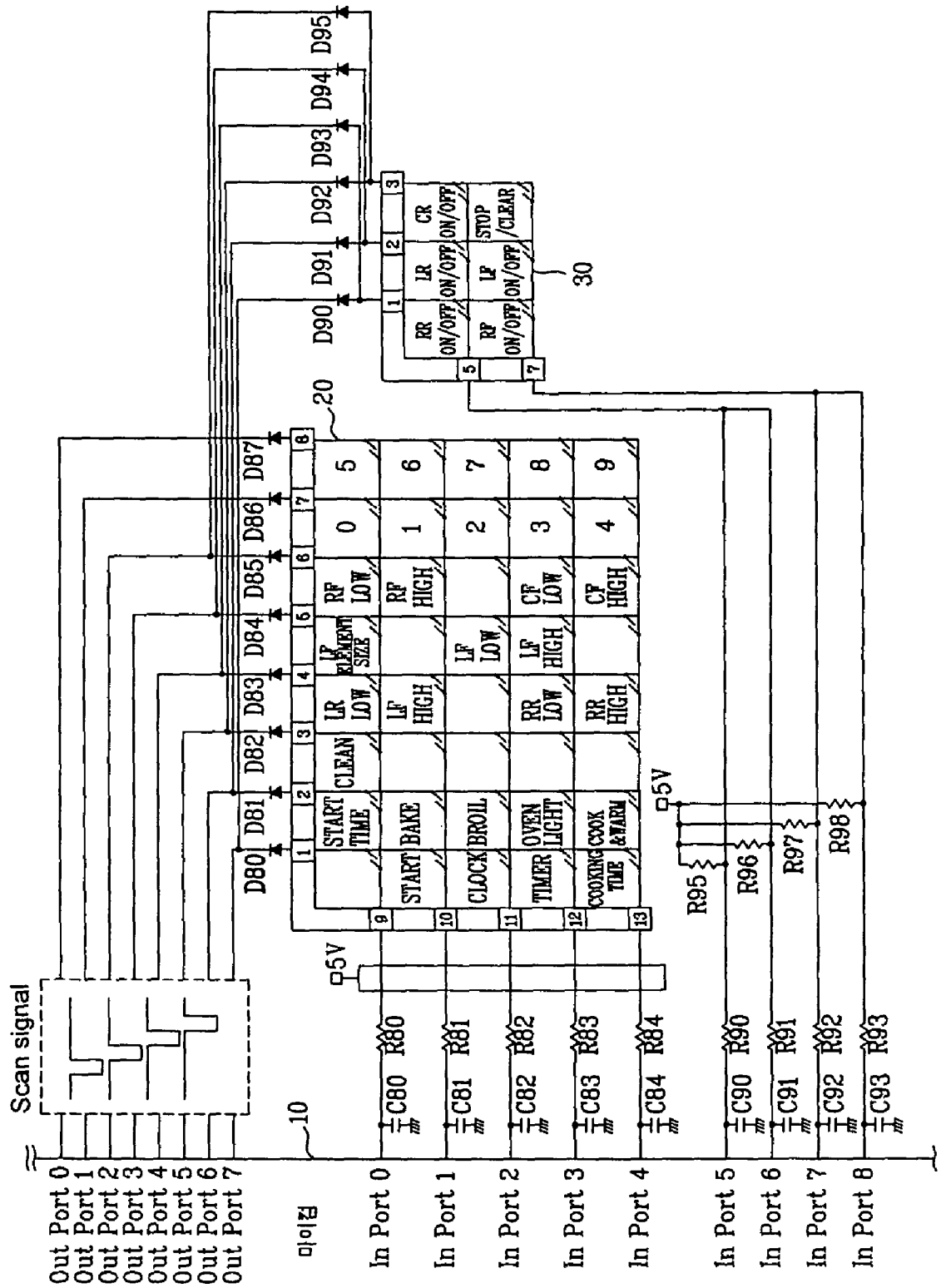
FIG. 1 is a circuit diagram of a scan type input device according to an embodiment of the present invention.

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a circuit diagram of a scan type input device according to an embodiment of the present invention.

Referring to FIG. 1, a key input device of the present invention includes a microcomputer 10 having a plurality of output ports (out ports 0-7) for outputting scan signals (pulse type signals), a plurality of input ports (in ports 0-8), a first key matrix 20 having columns connected to the respective output ports of the microcomputer 10 and lines connected to the respective input ports of the microcomputer 10, a second key matrix 20 having columns each connected to at least two output ports of the microcomputer 10 in parallel and lines each connected to at least two input ports of the microcomputer 10 in parallel.

Here, the first key matrix 20 includes function keys required fro controlling normal operations of the system. The second key matrix 30 includes function keys required for controlling important operations related to the on/off operation of a variety of loads or the power on/off operation.

For example, in the case of an electric range using an electric heater as a heat source, the first key matrix 20 includes a variety of function keys such as a start key, a timer key, a cooking time key, a start time key, a bake key, a broil key, an oven light key, a cook/warm key, a power level key, and a time input number keys (0-9), all of which are not related to the power off or load-off.

The second key matrix 30 includes a stop/clear key for turning off the power, on/off keys LF ON-OFF and RF ON-OFF corresponding to front-left and front-right heaters, and on/off keys LR ON-OFF, RR ON-FF, and CR ON-OFF corresponding to rear-left, rear-right, and rear-center heaters, all of which are related to the power off and the load off.

Particularly, one line of the second key matrix 30 is connected in parallel to two of the output ports (out ports 0-7) of the microcomputer 10 connected to the lines of the first key matrix 20 and one column of the second key matrix 30 is connected in parallel to two of the input ports (in ports 5-8) of the microcomputer regardless of the first key matrix 20 so that the second key matrix 30 can be controlled by a dual-path.

For example, when the second key matrix 30 is structured with 3*@, the first line is connected to the output ports (out ports 4 and 7) of the microcomputer 10 and the second line is connected to the output ports (out ports 3 and 6). In addition, the third line is connected to the output ports (out ports 2 and 5). The first column of the second key matrix 30 is connected to the input ports (in ports 5 and 6) of the microcomputer 10 and the second column is connected to the input ports (in ports 7 and 8).

With the above structure, the microcomputer 10 sequentially outputs the scan signals through the output ports (out ports 0-7) connected to the first and second key matrixes 20 and 30.

In the section where the scan signals are output, when there is a user contact with a specific key of the first key matrix 20, the key signal is output and the microcomputer 10 recognizes the key signal input through the input ports (in port 0-4).

Meanwhile, the second key matrix 20 receives the scan signals two times with respect to the one key and simultaneously outputs the key signal to two input ports according to the user contact with the key.

This is just in case where a circuit component between the output port of the microcomputer 10 and the second key matrix 30 or a circuit component between the second matrix 30 and the input port is damaged, broken, or opened. That is, the scan signal is provided two times during one cycle through the output port of the microcomputer and an identical key signal is received by two times through the two input ports.

That is, even when there is an error in one path of the second key matrix 30, the second key matrix 30 having only the keys related to the power off and the load off can receive the scan signal or outputs the key signal through another path.

Therefore, the power off or load off operation can be more stably controlled and thus the damage of the system or the fire of the system can be prevented in advance, thereby improving the reliability of the product.

In the above-described embodiment, although only the on/off keys are separated from the normal keys, the present invention is not limited to this. For example, the concept of the present invention can be applied for other important keys or the keys that frequently malfunction.

In addition, the output and input signals are applied twice for the specific key matrix 30, the present invention is not limited to this. For example, the output and input signals may be applied three times or more. In addition, the number of the input signals and the number of the output signals for a specific key may be different from each other.

Furthermore, the lines and columns may be exchanged with respect to the input and output signals of the microcomputer.

In addition, like the second key matrix, the first key matrix can be connected in parallel. In this case, the manufacturing cost may increase.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A key scan type input device comprising:
   a microcomputer having a plurality of output ports for outputting scan signals and a plurality of input ports for receiving key signals in a scan signal section;
   a first key matrix having a plurality of system control keys arranged in a x*y arrangement, lines of the keys being connected to the respective output ports of the microcomputer and columns of the keys being connected to the respective input ports; and
   a second key matrix having one or more system control keys arranged in a m*m arrangement, lines and columns being connected in parallel at least two of the output ports and at least two input ports of the microcomputer.

2. The key scan type input device according to claim 1, where the control keys of the second key matrix include on/off keys of a variety of loads.

3. The key scan type input device according to claim 1, wherein each line of the second key matrix is connected at least two of the output ports connected to the lines of the first key matrix.

4. The key scan type input device according to claim 1, wherein the second key matrix simultaneously outputs at least two key signals generated by a user contact with a key in the scan signal section by sequentially receiving the scan signals from at least two of the output ports of the microcomputer.

5. The key scan type input device according to claim 1, wherein the system control keys include at least one selected from the group consisting of a stop/clear key for turning off the power, on/off keys corresponding to front-left and front-right heaters, and on/off keys corresponding to rear-left, rear-right and rear-center heaters.

6. The key scan type input device according to claim 1, wherein one of the system control keys of the first key matrix corresponds to the output or input port of the microcomputer.

7. A key scan type input device comprising:
a microcomputer having a plurality of output ports and a plurality of input ports;
a first key matrix for transmitting a key signal to the microcomputer in a section of the scan signal output from the microcomputer when there is a user contact with a key; and
a second key matrix having a key connected in parallel to at least two output ports of the microcomputer so that at least two scan signals can be input to the key in one cycle of the scan signal output from the microcomputer and can be simultaneously output to the microcomputer in a normal operation.

8. The key scan type input device according to claim 7, where all function keys of the second key matrix are connected in parallel to the microcomputer.

9. The key scan type input device according to claim 7, wherein function keys arranged in at least one line of the function keys are connected in parallel to the microcomputer.

10. The key scan type input device according to claim 7, wherein function keys of the first key matrix are connected to the respective output and input ports of the microcomputer.

11. A key scan type input device comprising:
a microcomputer having a plurality of output ports and a plurality of input ports;
a first key matrix for transmitting a key signal to the microcomputer in a section of the scan signal output from the microcomputer when there is a user contact with a key; and
a second key matrix having a key connected in parallel to at least two output ports of the microcomputer so, that at least two scan signals can be simultaneously output to the microcomputer in a normal operation even when one of the scan signal is input from the microcomputer to the key.

12. The key scan type input device according to claim 11, where all function keys of the second key matrix are connected in parallel to the microcomputer.

13. The key scan type input device according to claim 11, wherein function keys arranged in at least one line of the function keys are connected in parallel to the microcomputer.

14. The key scan type input device according to claim 7, wherein function keys of the first key matrix are connected to the respective output and input ports of the microcomputer.

* * * * *